United States Patent [19]

Deboer et al.

[11] Patent Number: 6,150,208
[45] Date of Patent: Nov. 21, 2000

[54] DRAM CAPACITORS MADE FROM SILICON-GERMANIUM AND ELECTRODE-LIMITED CONDUCTION DIELECTRIC FILMS

[75] Inventors: Scott J. Deboer; Klaus F. Schuegraf; Ronald A. Weimer; Randhir P. S. Thakur, all of Boise, Id.

[73] Assignee: Micron Technology, Inc., Boise, Id.

[21] Appl. No.: 09/076,333

[22] Filed: May 11, 1998

Related U.S. Application Data

[62] Division of application No. 08/678,729, Jul. 11, 1996, Pat. No. 5,930,106.

[51] Int. Cl.$^7$ ................................................ H01L 21/8242
[52] U.S. Cl. ...................... 438/240; 438/3; 438/381; 438/393; 438/238; 438/239; 438/250; 257/296; 257/310; 257/311; 361/305
[58] Field of Search .................... 361/311–313, 320–322, 361/303–305; 438/239, 253, 254, 396, 397; 257/296, 297, 298, 306, 311, 300, 302, 303

[56] References Cited

U.S. PATENT DOCUMENTS

| | | | |
|---|---|---|---|
| 4,961,165 | 10/1990 | Ema | 365/182 |
| 5,130,106 | 7/1992 | Deboer et al. | 361/305 |
| 5,130,885 | 7/1992 | Frazan et al. | 361/313 |
| 5,138,411 | 8/1992 | Sandhu | 357/23.6 |
| 5,140,389 | 8/1992 | Kimura et al. | 357/23.6 |
| 5,142,438 | 8/1992 | Reinberg et al. | 361/313 |
| 5,396,093 | 3/1995 | Lu | 257/306 |

OTHER PUBLICATIONS

Three Dimensional Leakage Current in Corrugated Capacitor Cells—Extended abstracts of the 17th conference on solid State Devices and Materials, Tokyo, 1985, pp. 37–40.
Amorphous Silicon–Germanium–Boron Alloy Applied to Low–Loss and High–Speed Diodes Japanese Journal of Applied Physics, vol. 21, No. 11, Nov., 1982 pp. 1559–1565.
A Large Barrier Height Schottky Contact Between Amorphous Si–Ge–B and GaAs Japanese Journal of Applied Physics, vol. 22, No. 11, Nov., 1983 pp. L709–L711.

*Primary Examiner*—Matthew Smith
*Assistant Examiner*—Belur Keshavan

[57] ABSTRACT

An exemplary implementation of the present invention includes a capacitor for a dynamic random access memory cell having a first plate; a second plate; and a dielectric layer interposed between said first and second plates, with the dielectric layer being dominated by electrode-limited conduction, which includes tantalum pentoxide and silicon nitride, or a combination of the two. In a preferred implementation, one of the two capacitor plates is formed from a silicon-germanium layer, the second plate is formed from a metal and the dielectric layer is formed from tantalum pentoxide.

19 Claims, 2 Drawing Sheets

DRAM CAPACITORS MADE FROM SILICON-GERMANIUM AND ELECTRODE-LIMITED CONDUCTION DIELECTRIC FILMS

This application is a divisional to U.S. patent application Ser. No. 08/678,729, filed Jul. 11, 1996, U.S. Pat. No. 5,930,106.

FIELD OF THE INVENTION

This invention relates to semiconductor technology and, more specifically, to the design of capacitors used in dynamic random access memory (DRAM) cells in relation to the use of a silicon-germanium alloy layer as a charge storage surface along with a cell dielectric material dominated by electrode-limited conduction.

BACKGROUND OF THE INVENTION

The memory cells of dynamic random access memories are comprised of two main components: a field-effect transistor and a capacitor. In DRAM cells utilizing a conventional planar capacitor, far more chip surface area is dedicated to the planar capacitor than to the field-effect transistor (FET). Although planar capacitors have generally proven adequate for use in DRAM chips up to the one-megabit level, they are considered to be unusable for more advanced DRAM generations.

As component density in memory chips has increased, the shrinkage of cell capacitor size has resulted in a number of problems. Firstly, the alpha-particle component of normal background radiation can generate hole-electron pairs in the silicon substrate, which functions as the lower capacitor plate of the planar cell. This phenomena will cause a charge stored within the affected cell capacitor to rapidly dissipate, resulting in a "soft" error. Secondly, the sense-amp differential signal is reduced. This aggravates noise sensitivity and makes it more difficult to design a sense-amp having appropriate signal selectivity. Thirdly, as cell capacitor size is decreased, the cell refresh time must generally be shortened, thus requiring more frequent interruptions for refresh overhead. The difficult goal of a DRAM designer is therefore to increase or, at least, maintain cell capacitance as cell size shrinks, without resorting to processes that reduce product yield or that markedly increase the number of masking and deposition steps in the production process.

As a result of the problems associated with the use of planar capacitors for high-density DRAM memories, manufacturers are utilizing cell designs based on non-planar capacitors. Two basic non-planar capacitor designs are currently in use: the trench capacitor, and the stacked capacitor. Both types of non-planar capacitors typically require a considerably greater number of masking, deposition and etching steps for their manufacture than does a planar capacitor.

U.S. Pat. No. 5,130,885, hereby incorporated by reference, discloses the use of a silicon-germanium alloy having a rough surface morphology as the capacitive surface of the storage-node plate of the cell capacitor along with the use of a cell dielectric layer which exhibits the property of bulk-limited conduction. In bulk limited materials, the dielectric film's properties dominate the amount of leakage current through a capacitor. For such a capacitor, the material used for the top and bottom electrodes plays an insignificant part in determining the leakage current through a capacitor. That is to say, a capacitor having both plates made of, say aluminum, would possess very nearly the same conduction properties as would a capacitor with conductively doped polysilicon or silicon-germanium electrodes. Studies have shown that a dielectric material, such as silicon nitride, exhibits bulk-limited conduction when the silicon nitride film thickness is greater than 100 Å.

However, advances in equipment technology, used to deposit films, has provided the ability to deposit thin dielectric films, such as tantalum pentoxide ($Ta_2O_5$) and silicon nitride ($Si_3N_4$) that exhibit electrode-limited conduction. Using the advances in equipment to deposit thin dielectrics provide consistent film thickness which exhibit excellent reliability in terms of consistent dielectric properties throughout the film. Taking advantage of these films for use in DRAM fabrication presents new challenges over known processing techniques. The present invention teaches how to take advantage of the electrode-limited conduction in these dielectric films and thus provides methods for forming a highly reliable storage capacitor, as will become apparent in the following disclosure.

SUMMARY OF THE INVENTION

An exemplary implementation of the present invention includes a capacitor for a dynamic random access memory cell having a first plate; a second plate; and a dielectric layer interposed between the first and second plates, the dielectric layer, being dominated by electrode-limited conduction, includes tantalum pentoxide, silicon nitride and barium strontium titanate (BST) films.

In a preferred implementation, one of the two capacitor plates is formed from a silicon-germanium layer and the second plate is formed from a metal based material or another silicon-germanium layer.

An exemplary implementation for forming the capacitor described above includes the steps of forming a first capacitor electrode from silicon-germanium; of forming a cell dielectric layer over the first capacitor electrode, the dielectric layer being dominated by electrode-limited conduction; and of forming a second capacitor electrode over the cell dielectric layer.

DETAILED DESCRIPTION OF THE INVENTION

Exemplary embodiments of the present invention are depicted in FIGS. 1 through 4. These exemplary embodiments will be appreciated by one skilled in the art, as taught from the following descriptions of the invention.

Figure 1:
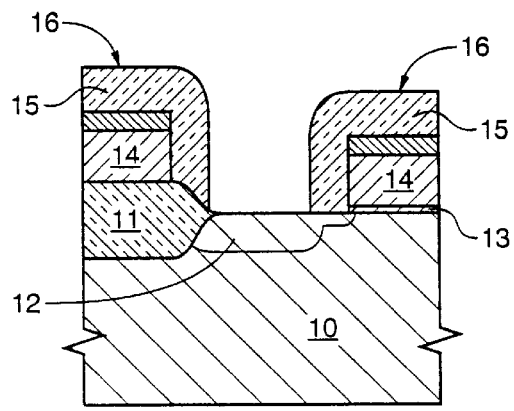
FIG. 1 shows an in-process semiconductor wafer assembly having wordlines formed on a silicon substrate in a DRAM array as depicted in a cross-sectional view.

Referring now to FIG. 1, an in-process semiconductor wafer assembly of a DRAM array, having wordlines 16 formed thereon, is depicted in a cross-sectional view. In this cross-sectional view, wordlines 16 comprise of gate oxide 13, gate conductor 14 and gate insulator 15. As seen in this particular view, a first wordline is isolated from silicon substrate 10 by field oxide 11. Aligned to wordlines 16 are diffusion regions 12 that have been implanted into silicon substrate 10.

Figure 2:
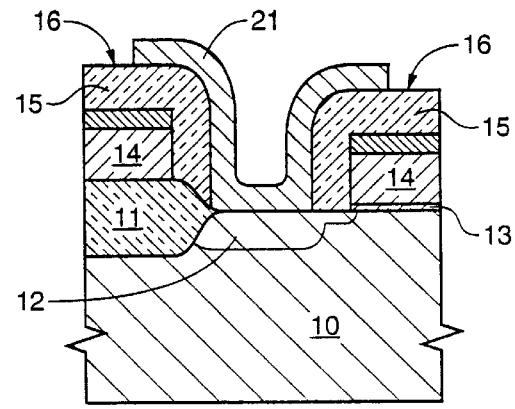
FIG. 2 is a cross-sectional view of the in-process DRAM array of FIG. 1 following the forming and patterning of a storage-node electrode from conductively doped silicon-germanium, metals, metal silicides, or metal nitrides.

Referring now to FIG. 2, conductive electrode (or plate) 21 is formed from a conductive layer of material that has been patterned and etched. Conductive electrode 21 makes contact to an underlying diffusion region 12.

Figure 3:
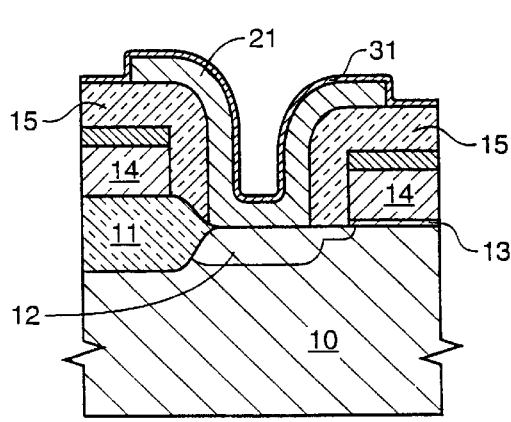
FIG. 3 is a cross-sectional view of the in-process DRAM array of FIG. 2 following deposition of a dielectric layer that is dominated by electrode-limited conduction.

Referring now to FIG. 3, dielectric layer 31 is formed to cover plate 21 and wordlines 16. The dielectric characteristics of dielectric layer 31 are dominated by electrode-limited conduction. Examples of electro-delimited conduction dielectrics include silicon nitrides, tantalum oxides, barium strontium titanate (BST), etc. In electrode-limited conduction materials, the dielectric leakage current mechanism is dominated by the material properties of the capacitor electrodes. For silicon nitrides however, in order to activate the dominant electrode-limited conduction mechanism in a capacitor, the dielectric thickness must be less than 100 Å (preferably 60 Å or less).

Figure 4:
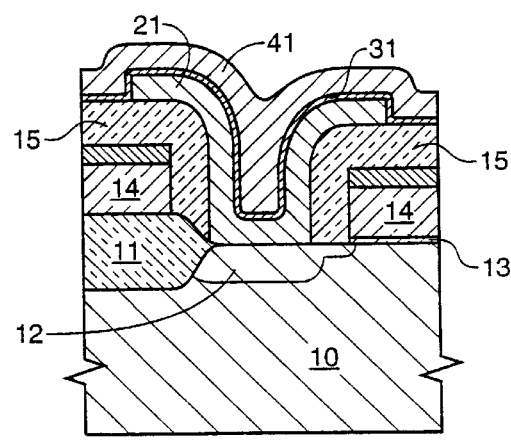
FIG. 4 is a cross-sectional view of the in-process DRAM array of FIG. 3 following the formation of a top capacitor electrode from conductively doped silicon-germanium, metals, metal suicides, or metal nitrides.

Referring now to FIG. 4, a top capacitor electrode (or plate) 41 is formed over dielectric 31 to complete the storage capacitor fabrication. It is preferred that the storage (or bottom) electrode be formed from conductively doped silicon-germanium, and that the top electrode be a metal based electrode, such as titanium, titanium silicide, titanium nitride, tungsten, tungsten silicide, tungsten nitride, molybdenum or other refractory metals. However, the composition of the two electrodes may be switched or both electrodes may be formed from conductively doped silicon-germanium. It is further preferred that at least one of the electrodes possess a silicon-germanium surface as its charging surface and the dielectric must be dominated by the electrode-limited conduction controlling mechanism. The silicon-germanium may be formed by conventional deposition techniques, including Low Pressure Chemical Vapor Deposition (LPCVD) or Plasma Enhanced Chemical Vapor Deposition (PECVD). It is preferred that the deposited silicon-germanium layer has a rough surface morphology as characterized by macroscopic islanding of alloy crystals.

The preferred amount of germanium in the germanium-silicon film ranges from $10^{14}$ atoms cm$^{-3}$ to less than 100%, and the film may be graded so the larger germanium concentration is near the electrode/dielectric interface to gain maximum barrier height. Also, having the larger germanium concentration near the electrode/dielectric interface will limit the amount of germanium which can diffuse back to the buried contact (wafer).

The preferred cell dielectric includes tantalum pentoxide or a silicon nitride film or even a combination of the two. It is preferred that if tantalum pentoxide is selected, it have a thickness of approximately 120 Å (most preferably 85 Å or less) and that if a silicon nitride film is selected, it have a preferred thickness of approximately 100 Å or less (most preferably 60 Å or less). If a combination of tantalum pentoxide and silicon nitride is utilized then the overall preferred thickness is approximately 150 Å (approximately 5–50 Å of silicon nitride and approximately 10–100 Å of tantalum pentoxide). Also, a cell dielectric of BST that is less than 1000 Å, may be utilized as an effective electrode-limited conduction dielectric.

Figure 5:
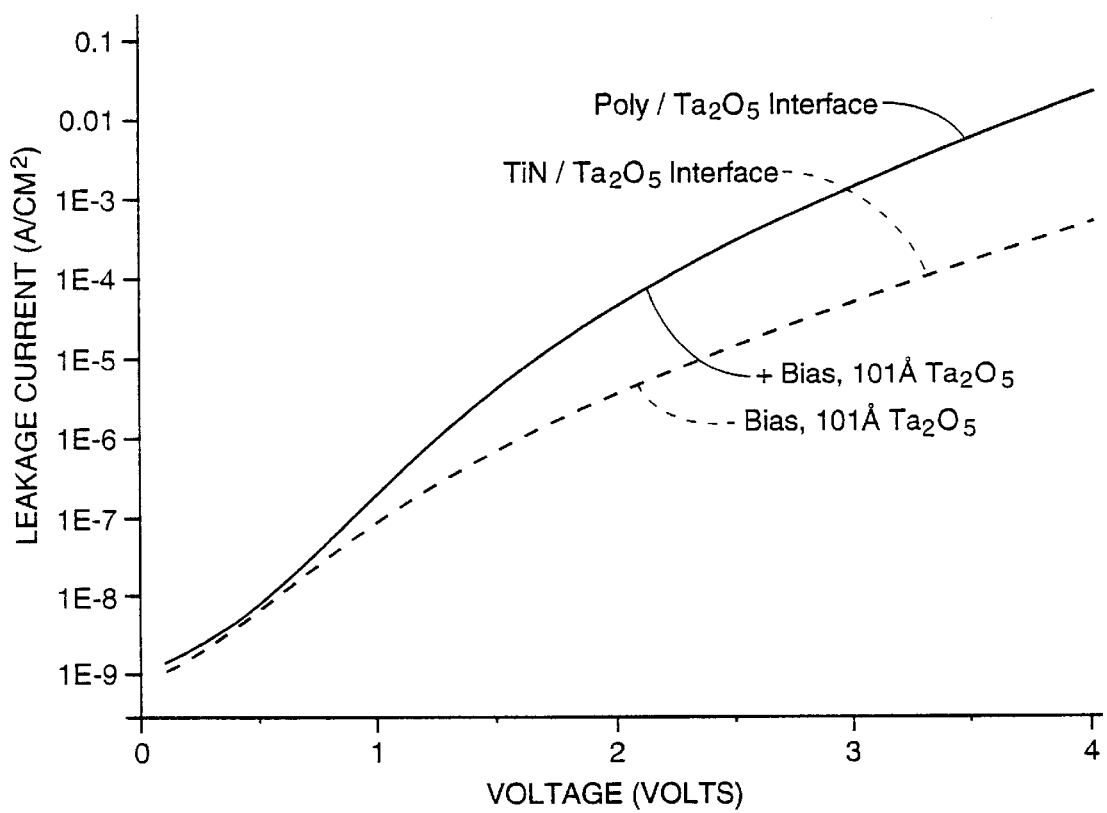
FIG. 5 is a graph showing the comparison between the leakage currents through two capacitors having different dielectric to electrode interfaces.

The importance of the material used for one (or both) of the conductors in conjunction with the dielectric material selected, s illustrated in the graph of FIG. 5. This graph compares the leakage current through two capacitors having different dielectric to electrode interfaces. As this graph illustrates, the solid line shows that a polysilicon/tantalum pentoxide interface has a higher leakage current than does a titanium nitride/tantalum pentoxide interface (Note that both capacitors were made with a tantalum pentoxide layer having a thickness of approximately 100 Å). For example, with a 3V bias on each capacitor, the leakage of the capacitor having the polysilicon/tantalum pentoxide interface is greater than the capacitor having the titanium nitride/tantalum pentoxide interface by more than one order of magnitude, which becomes significant in terms of refreshing the storage cell. Thus, a device utilizing materials (capacitor electrodes and cell dielectric material) that cause a capacitor to operate in an electrode-limited conduction, as taught in the present invention, gain a big advantage over conventional capacitors in by retaining stored information longer.

After capacitor formation is completed, as directed by exemplary implementations of the present invention, the array may be completed in a conventional manner. Although exemplary embodiments of the present invention are disclosed herein, it will be evident to those having ordinary skill in the art of semiconductor fabrication that changes and modifications may be made thereto without departing from the scope and spirit of the invention as claimed.

What is claimed is:

1. A method for forming a capacitor for a dynamic random access memory cell comprising the steps of:

forming a first capacitor electrode;

forming a cell dielectric layer over said first capacitor electrode, said dielectric layer being dominated by electrode-limited conduction; and forming a second capacitor electrode over said cell dielectric layer;

wherein, at least one of said electrodes is formed from silicon-germanium.

2. The method of claim 1, wherein said silicon-germanium comprises $10^{14}$ atoms cm$^{-3}$ to less than 100% germanium.

3. The method of claim 1, wherein said step of forming said silicon-germanium comprises depositing a silicon-germanium layer having a rugged surface morphology.

4. The method of claim 1, wherein said step of forming a dielectric layer comprises forming a tantulum pentoxide film having a thickness no greater than 120 Å.

5. The method of claim 1, wherein said step of forming a dielectric layer comprises forming a tantulum pentoxide film having a thickness no greater than 85 Å.

6. The method of claim 1, wherein said step of forming a dielectric layer comprises forming a silicon nitride film having a thickness no greater than 100 Å.

7. The method of claim 1, wherein said step of forming a dielectric layer comprises forming tantulum pentoxide and silicon nitride films having a combined thickness no greater than 150 Å.

8. The method of claim 1, wherein said step of forming a dielectric layer comprises forming a silicon nitride film having a thickness no greater than 60 Å.

9. The method of claim 1, wherein said step of forming a dielectric layer comprises forming a barium strontium titanate film having a thickness no greater than 1000 Å.

10. A method for forming a capacitor for a dynamic random access memory cell comprising the steps of:

forming a first capacitor plate from a conductively-doped, silicon-germanium layer;

forming a dielectric layer over said first plate, said dielectric layer being dominated by electrode-limited conduction; and forming a second capacitor plate over said dielectric layer, said second plate formed from a metal layer.

11. The method of claim 10, wherein said step of forming a first plate comprises forming said silicon-germanium layer that comprises $10^{14}$ atoms $cm^{-3}$ to less than 100% germanium.

12. The method of claim 10, wherein said step of forming a first plate further comprises depositing a silicon-germanium layer having a rough surface morphology.

13. The method of claim 10, wherein said step of forming a dielectric layer comprises a forming a tantalum pentoxide film having a thickness no greater than 120 Å.

14. The method of claim 10, wherein said step of forming a dielectric layer comprises forming a tantalum pentoxide film having a thickness no greater than 85 Å.

15. The method of claim 10, wherein said step of forming a dielectric layer comprises forming a silicon nitride film having a thickness no greater than 100 Å.

16. The method of claim 10, wherein said step of forming a dielectric layer comprises forming tantalum pentoxide and silicon nitride films having a combined thickness no greater than 150 Å.

17. The method of claim 10, wherein said step of forming a dielectric layer comprises forming a silicon nitride film having a thickness no greater than 60 Å.

18. The method of claim 10, wherein said step of forming a dielectric layer comprises forming a barium strontium titanate film having a thickness no greater than 1000 Å.

19. The method of claim 10, wherein said step of forming a metal layer comprises forming a metal selected from the group consisting of titanium, titanium silicide, titanium nitride, tungsten, tungsten silicide, tungsten nitride, molybdenum and other refractory metals.

\* \* \* \* \*